United States Patent
Iwakiri et al.

(10) Patent No.: US 11,282,917 B2
(45) Date of Patent: Mar. 22, 2022

(54) SEMICONDUCTOR DEVICE AND METHOD OF MANUFACTURING THE SAME

(71) Applicant: RENESAS ELECTRONICS CORPORATION, Tokyo (JP)

(72) Inventors: Kazuhiko Iwakiri, Tokyo (JP); Akira Matsumoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/889,725

(22) Filed: Jun. 1, 2020

(65) Prior Publication Data
US 2021/0066445 A1 Mar. 4, 2021

(30) Foreign Application Priority Data

Aug. 26, 2019 (JP) .............................. JP2019-153963

(51) Int. Cl.
*H01L 21/768* (2006.01)
*H01L 23/522* (2006.01)
*H01L 23/64* (2006.01)
*H01L 49/02* (2006.01)
*H01L 21/67* (2006.01)

(52) U.S. Cl.
CPC ........ *H01L 28/10* (2013.01); *H01L 21/67138* (2013.01); *H01L 21/76832* (2013.01); *H01L 21/76834* (2013.01); *H01L 23/5227* (2013.01); *H01L 23/645* (2013.01)

(58) Field of Classification Search
CPC ... H01L 28/10; H01L 23/5227; H01L 23/645; H01L 21/76832; H01L 21/76834
See application file for complete search history.

(56) References Cited

U.S. PATENT DOCUMENTS

2008/0157217 A1* 7/2008 Burke ............... H01L 21/76846
257/379
2014/0028543 A1 1/2014 Lo et al.

FOREIGN PATENT DOCUMENTS

JP 2016-219819 A 12/2016

* cited by examiner

*Primary Examiner* — Thanhha S Pham
(74) *Attorney, Agent, or Firm* — McDermott Will & Emery LLP

(57) ABSTRACT

A semiconductor device including a multilayer wiring layer comprising a first wiring, a first insulating film formed on the multilayer wiring layer and having a first opening exposing a portion of the first wiring, a second insulating film formed on the first insulating film and having a second opening continuing with the first opening, and an inductor formed of the first wiring, and a second wiring electrically connected with the first wiring through a via formed in the first opening. A side surface of the via contacts with the first insulating film, and does not contact with the second insulating film.

11 Claims, 17 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2019-153963 filed on Aug. 26, 2019 including the specification, drawings and abstract is incorporated herein by reference in its entirety.

BACKGROUND

Embodiments relate to a semiconductor device and method of manufacturing the semiconductor device, for example, to a semiconductor device and method of manufacturing the semiconductor device including an inductor.

There is a disclosed technique listed below.
[Patent Document 1] Japanese Unexamined Patent Application Publication No. 2016-219819

A semiconductor device including an inductor is known (see, for example, Patent Document 1). The semiconductor device disclosed in Patent Document 1 includes a multilayer wiring layer, a protective film formed on the multilayer wiring layer, and an inductor formed on the multilayer wiring layer. The inductor is formed by a first wiring formed in the multilayer wiring layer, and a second wiring formed on the protective film. The first wiring and the second wiring are electrically connected through a via such that the via penetrates the protective film.

When the protective film is formed of a first insulating film and a second insulating film formed on the first insulating film, the via may be formed to bury a first opening formed in the first insulating film and a second opening formed in second insulating film. In this instance, the second opening needs to be formed in accordance with a position of the first opening. Because of the limited alignment accuracy of the second opening, the large second opening may be formed to provide the desired margin. As a result, there is a problem that the semiconductor device is larger. That is, in the semiconductor device, there is room for improvements from the viewpoint of miniaturization.

A problem of embodiment is to downsize the semiconductor device. Other problems and novel features will become apparent from the description of the specification and drawings.

SUMMARY

A semiconductor device according to embodiments includes a multilayer wiring layer including a first wiring, a first insulating film formed on the multilayer wiring layer, and having a first opening exposing a portion of the first wiring, a second insulating film formed on the first insulating film, and having a second opening communicating with the first opening, and an inductor configured with the first wiring and a second wiring electrically connected with the first wiring through a via formed in the first opening. A side surface of the via is contacted with the first insulating film without contacting with the second insulating film.

A method of manufacturing a semiconductor device according to embodiments includes forming a multilayer wiring layer including a first wiring, forming a first insulating film on the multilayer wiring layer so as to cover the first wiring, forming a first opening exposing a portion of the first wiring in the first insulating film, forming a second insulating film on the first insulating film so as to bury the first opening, forming a second opening continuing to the first opening in the second insulating film, and forming a second wiring electrically connected through a via formed in the first opening to form an inductor. A side surface of the via is contacted with the first insulating film without contacting with the second insulating film.

According to embodiments, the semiconductor device can be miniaturized.

DETAILED DESCRIPTION

Figure 1:
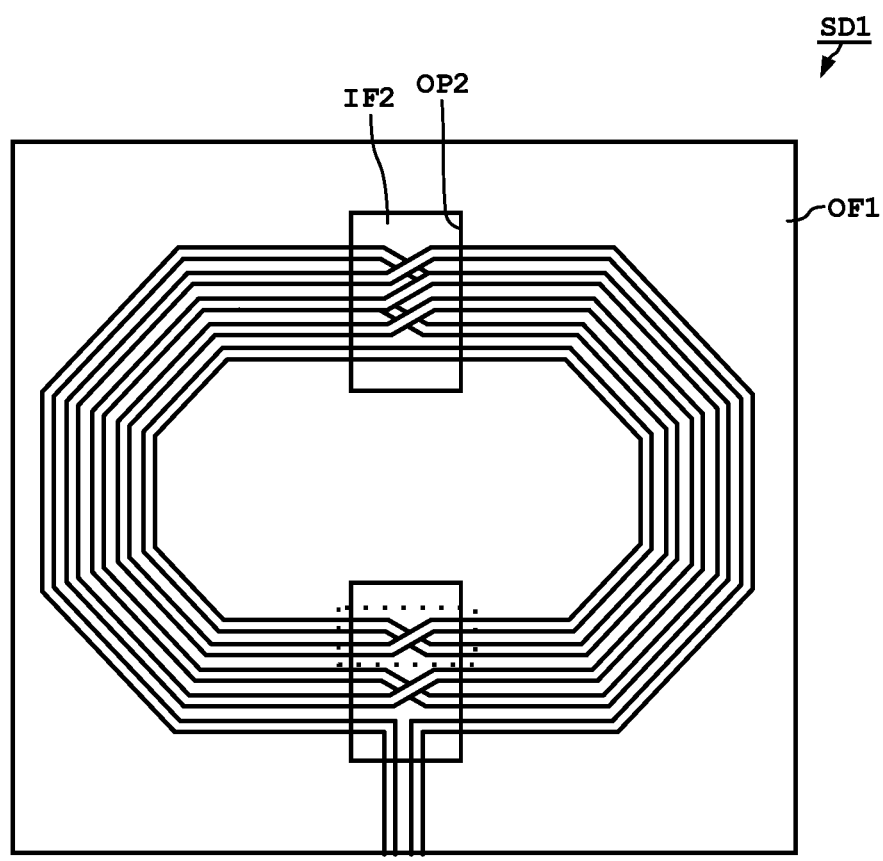
FIG. 1 is a plan view showing an exemplary configuration of a main portion of a semiconductor device according to a first embodiment.

Hereinafter, a semiconductor device according to embodiments will be described in detail by referring to the drawings. In the specification and the drawings, the same or corresponding element are denoted by the same reference numerals, and a repetitive description thereof is omitted. In the drawings, for convenience of description, the configuration may be omitted or simplified. At least a portion of each embodiment and each modification may be arbitrarily combined with each other. In addition, a cross-sectional view may also be shown as an end view.

First Embodiment

As will be described in detail later, in a semiconductor device SD1 according to a first embodiment, a second opening OP2 formed in an organic film OF1 overlaps with both a first via V1 and a crossing part CP in plan view.

(Configuration of Semiconductor Device)

Figure 2:
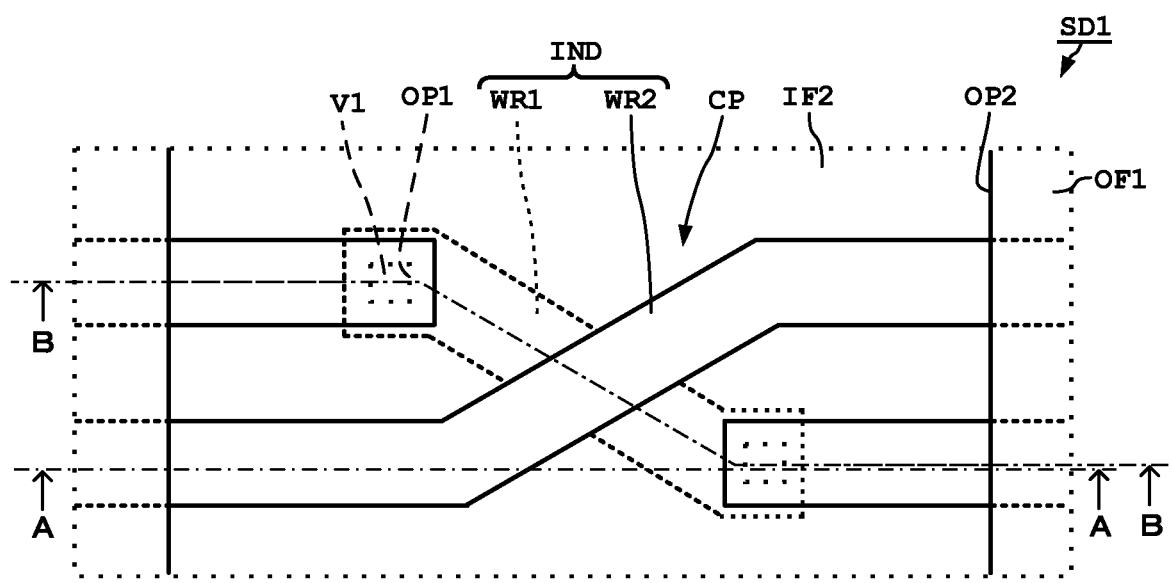
FIG. 2 is a partially enlarged plan view showing a region indicated by a dashed line in FIG. 1.
Figure 3A:
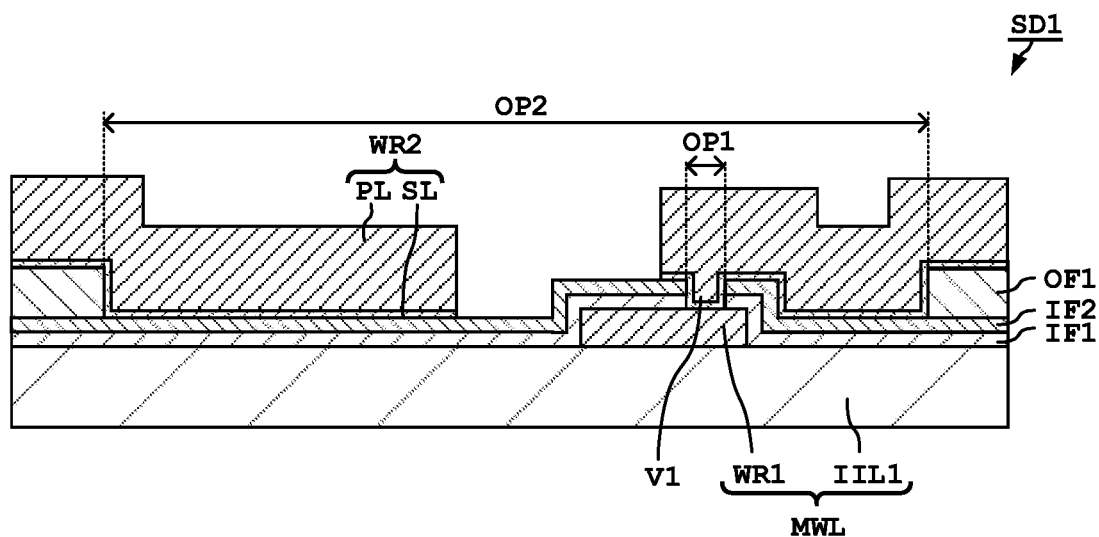
FIG. 3A is a cross-sectional view taken along line A-A of FIG. 2.
Figure 3B:
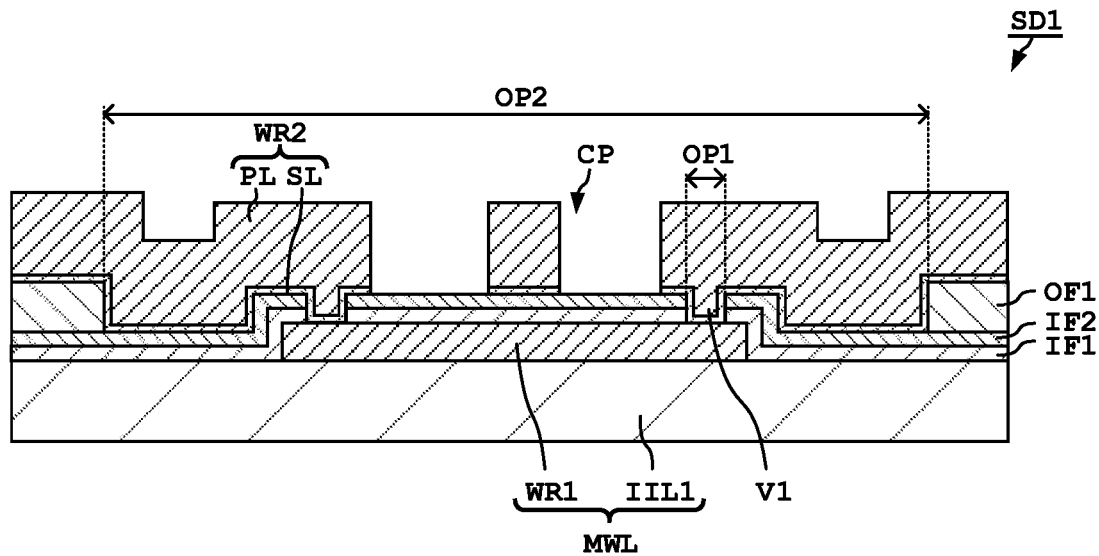
FIG. 3B is a cross-sectional view taken along line B-B of FIG. 2.

FIG. 1 is a plan view showing an exemplary configuration of a main portion of a semiconductor device SD1 according to a first embodiment. FIG. 2 is a partially enlarged plan view showing a region indicated in a dashed line in FIG. 1. FIG. 3A is a cross-sectional view taken along line A-A of FIG. 2. FIG. 3B is a cross-sectional view in line B-B of FIG. 2.

A semiconductor device SD1 includes a multilayer wiring layer MWL, a first inorganic film IF1, a second inorganic film IF2, an organic film OF1, and an inductor IND. As will be described in detail later, the inductor IND includes a first wiring WR1 and a second wiring WR2 electrically connected with each other through a first via V1.

The multilayer wiring layer MWL is layers formed of two or more wiring layers. The multilayer wiring layer MWL is formed on a substrate (not shown). A semiconductor element such as a transistor is formed on a main surface of the substrate. In FIGS. 3A and 3B, a wiring layer formed on an uppermost layer of the multilayer wiring layer MWL is shown. The multilayer wiring layer MWL is a layer including an interlayer insulating layer and one or both of a wiring and a via (also referred to as "plug") formed in the interlayer insulating layer. The via is a conductive member electrically connecting two wirings formed in layers that differ from each other.

In the first embodiment, the multilayer wiring layer MWL includes a first interlayer insulating layer IIL1 and a first wiring WR1.

The first interlayer insulating layer IIL1 is a layer constituting a part of the multilayer wiring layer MWL. In the first embodiment, the first interlayer insulating layer IIL1 is an insulating layer located in the uppermost layer of the multilayer wiring layer MWL. In other words, the first interlayer insulating layer IIL1 directly contacts with the first inorganic film IF1. As the first interlayer insulating layer IIL1, a configuration known as wiring in the semiconductor technology can be adopted. Examples of materials of the first interlayer insulating layer IIL1 include, for example, silicon oxide ($SiO_2$).

The first wiring WR1 is formed on the first interlayer insulating layer IIL1. The first wiring WR1, as described later, constitutes a portion of the inductor IND. The first wiring WR1 is electrically connected with a semiconductor element such as a transistor. As the first wiring WR1, a configuration known as a wiring in the semiconductor technology may be adopted. The first wiring WR1 is, for example, a first barrier metal, a conductive film and a second barrier metal is a stacked film formed in this order. Examples of materials of the first barrier metal and the second barrier metal include titanium (Ti), titanium nitride (TiN), tantalum (Ta) and tantalum nitride (TaN). Examples of the material of the conductive film include aluminum (Al) and copper (Cu).

The first inorganic film IF1 is formed on the multilayer wiring layer MWL. In the first embodiment, the first inorganic film IF1 is formed on the first interlayer insulating layer IIL1 such that the first inorganic film IF1 covers the first wiring layer WR1. The first inorganic film IF1 may protect the semiconductor element from external moisture or the like. Examples of materials of the first inorganic film IF1 include silicon oxide, silicon oxynitride, and silicon nitride. A thickness of the first inorganic film IF1 is, for example, 0.5 µm or more and 1.0 µm or less.

The second inorganic film IF2 is an insulating film having moisture resistance. Examples of materials of the second inorganic film IF2 include silicon oxynitride and silicon nitride. A thickness of second inorganic film IF2 is, for example, 0.5 µm or more and 1.0 µm or less.

Here, the "inorganic film" is a film composed of a compound other than a compound containing carbon atoms and hydrogen atoms (organic compound).

A first opening OP1 is formed in the first inorganic film IF1 and the second inorganic film IF2 to expose a portion of the first wiring WR1 from the first inorganic film IF1 and the second inorganic film IF2. The first opening OP1 may have any shapes and sizes as long as the first via V1 for electrically connecting the first wiring WR1 and the second wiring WR2 can be appropriately formed in the first opening OP1.

The material of the first inorganic film IF1 and the material of the second inorganic film IF2 may be the same or different from each other. The thickness of the first inorganic film IF1 may be the same as the thickness of the second inorganic film IF2, may be greater than the thickness of the second inorganic film IF2, or may be smaller than the thickness of the second inorganic film IF2.

The organic film OF1 is an insulating film formed on the second inorganic film IF2. The organic film OF1 may protect the semiconductor element from external moisture or the like. Examples of materials for the organic film OF1 include polyimide. A thickness of the organic film OF1 is, for example, 3.0 µm or more and 7.0 µm or less.

Here, the "organic film" is a film composed of a compound (organic compound) containing carbon atoms and hydrogen atoms.

A second opening OP2 is formed in the organic film OF1 to expose a portion of the second inorganic film IF2 from the organic film OF1. The second opening OP2 communicates with the first opening OP1. A size of second opening OP2 is greater than a size of the first opening OP1. The second opening portion OP2 is formed such that the second opening portion OP2 exposes a portion of the first inorganic film IF1 and the second inorganic film IF2 covering an upper surface and a side surface of the second wiring WR2 from the second inorganic film IF2.

In the first embodiment, the second opening OP2 overlaps with the first via V1 and the crossing part CP in plan view. The number of the first vias V1 and the crossing parts CP overlapping with the second opening OP2 in plan view is appropriately adjusted in accordance with the number of turns of the inductor IND. The number of the first vias V1 overlapping with the second opening OP2 in the plan view may be two or more, or may be four or more. The number of crossing part CP overlapping with the second opening OP2 in plan view may be two or more, or may be four or more. In the present embodiment, the number of first vias V1 overlapping with the second opening OP2 in plan view is eight. Further, the number of crossing part CP overlapping with the second opening OP2 in plan view is four.

The inductor IND may constitute a part of a balun element, or may constitute a part of a digital isolator. The inductor IND includes a first wiring WR1 and a second wiring WR2. The first wiring WR1 and the second wiring WR 2 are electrically connected with each other through the first via V1. The inductor IND includes the crossing part CP at which the first wiring WR WR1 and the second WR wiring WR2 cross with each other in plan view.

Here, "the first via V1" means a conductive member electrically connecting two wirings located in different layers and includes a side surface contacting with an inner side surface of a through hole formed in an insulating film over the entire circumference in plan view.

The first wiring WR1 is formed in multilayer wiring layer MWL. In other words, the first wiring WR1 is formed below the first inorganic film IF1. The first wiring WR1 may be an uppermost layer wiring of the multilayer wiring layer MWL, or may be a wiring formed in a lower layer than the uppermost layer wiring. In the first embodiment, the first wiring WR1 is the uppermost layer wiring.

The first wiring WR1 may be aluminum wiring or copper wiring. In the first embodiment, the first wiring WR1 is aluminum wiring. For example, the first wiring WR1 is a stacked film in which a lower barrier metal film, a conductive film and an upper layer barrier metal film are formed in this order. Examples of materials for the lower barrier metal film and the upper barrier metal film include titanium (Ti), titanium nitride (TiN), tungsten titanium (TiW), titanium oxide ($TiO_2$), tantalum (Ta), and tantalum nitride (TaN). The main component of the conductive film is aluminum.

The second wiring WR2 is electrically connected with the first wiring WR1 through the first via V1 formed in the first opening OP1. The second wiring WR2 may be formed integrally with the first via V1 as a single member, or may be formed separately. Here, "integrally" means a layer formed at the same timing in one step. In the first embodiment, the second wiring WR2 is a plating electrode formed on the first wiring WR1. That is, the second wiring WR2 is formed integrally with the first via V1 as a single member.

The second wiring WR2 is copper wiring. The second wiring WR2 is a stacked film in which a seed layer SL and a plating layer PL are formed in this order. The main component of the seed layer SL and the plating layer PL are copper.

In the first embodiment, a lower surface of the second wiring WR2 directly contacts with an upper surface of the second inorganic film IF2 in the second wiring WR2. The lower surface of the second opening OP2 directly contacts an upper surface of the organic film OF1 outside the second opening OP2.

The material of the first wiring WR1 and the material of the second wiring WR2 may be the same or different from each other. As previously stated, in the first embodiment, the first wiring WR1 is aluminum wiring and the second wiring WR2 is copper wiring.

A thickness of the first wiring WR1 may be the same as a thickness of the second wiring WR2, may be greater than a thickness of the second inorganic film IF2, or may be smaller than the thickness of the second inorganic film IF2. In the first embodiment, the thickness of the first wiring film WR1 is smaller than the thickness of second inorganic film IF2.

A planar shape of the inductor IND (the second wiring WR2), in plan view, as long as a function as the inductor IND is obtained, is not particularly limited. For example, the inductor IND may have a substantially octagonal shape in plan view, or may have a substantially circular shape in plan view.

The side surface of the first via V1 contacts with the first inorganic film IF1 and the second inorganic film IF2, and does not contact with the organic film OF1. That is, the first via V1 is formed in the first opening OP1 formed in the first inorganic film IF1 and the second inorganic film IF2. The first via V1, of the second wiring WR2, is not formed in the second opening OP2.

(Method of Manufacturing Semiconductor Device)

Next, an exemplary method of manufacturing the semiconductor device SD1 according to the first embodiment will be described. FIGS. 4 to 10 are a cross-sectional views showing exemplary steps included in the method of manufacturing the semiconductor device SD1. FIGS. 4 to 10 show cross-sectional views corresponding to FIG. 3A in the respective steps.

The method of manufacturing the semiconductor device SD1 according to the first embodiment includes (1) forming a multilayer wiring layer MWL, (2) forming a first inorganic film IF1, (3) forming a second inorganic film IF2, (4) forming a first opening OP1, (5) forming an organic film OF1, (6) forming a second opening OP2, and (7) forming an inductor IND.

(1) Forming a Multilayer Wiring Layer MWL

Figure 4:
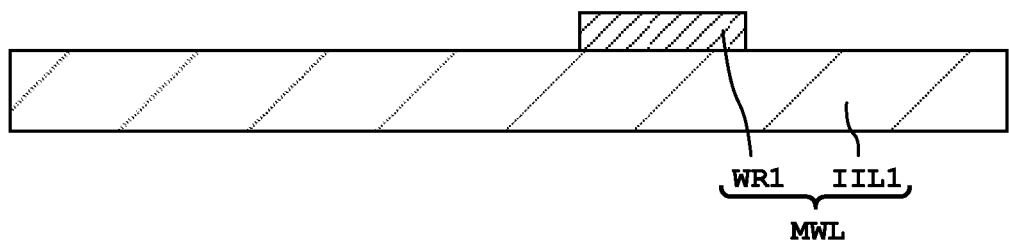
FIG. 4 is a cross-sectional view showing an exemplary step included in a method of manufacturing the semiconductor device according to the first embodiment.

First, as shown in FIG. 4, the first interlayer insulating layer IIL1 and the first wiring WR1 are formed on a substrate (not shown). The method of forming the first interlayer insulating layer IIL1 and the first wiring WR1 is not particularly limited, and a known method in the art of manufacturing semiconductor device can be adopted. The method of forming the first interlayer insulating layer IIL1 is, for example, CVD method. An upper surface of the first interlayer insulating layer IIL1 may be planarized by the CMP method. The first wiring WR1 may be formed by patterning a conductive film formed on the first interlayer insulating layer IIL1 by etching method. Note that if the first wiring WR1 is copper wiring, the method of forming the first wiring WR1 is damascene method.

(2) Forming a First Inorganic Film IF1

Figure 5:
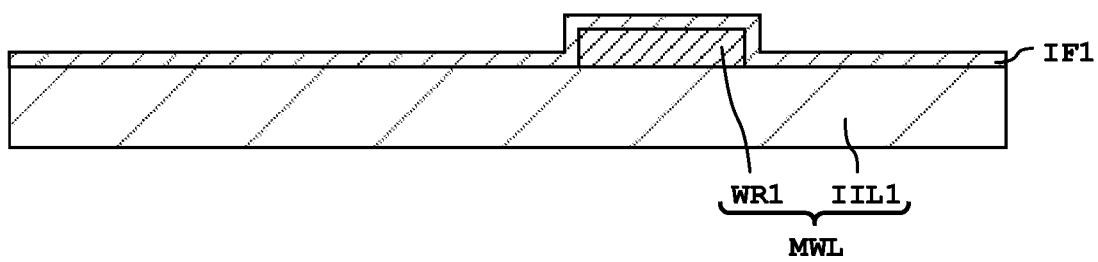
FIG. 5 is a cross-sectional view showing an exemplary step included in the method of manufacturing the semiconductor device according to the first embodiment.

Next, as shown in FIG. 5, the first inorganic film IF1 is formed on the multilayer wiring layer MWL so as to cover the first wiring WR1. The method of forming the first inorganic film IF1 is, for example, CVD method.

(3) Forming a Second Inorganic Film IF2

Figure 6:
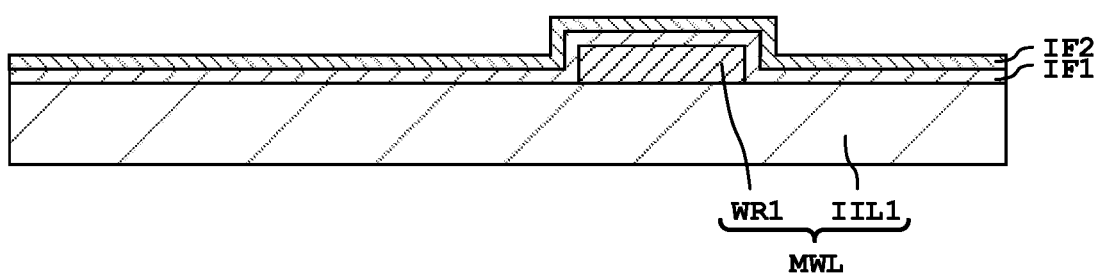
FIG. 6 is a cross-sectional view showing an exemplary step included in the method of manufacturing the semiconductor device according to the first embodiment.

Subsequently, as shown in FIG. 6, the second inorganic film IF2 is formed on the first inorganic film IF1. The method of forming the second inorganic film IF2 is, for example, CVD method.

(4) Forming a First Opening OP1

Figure 7:
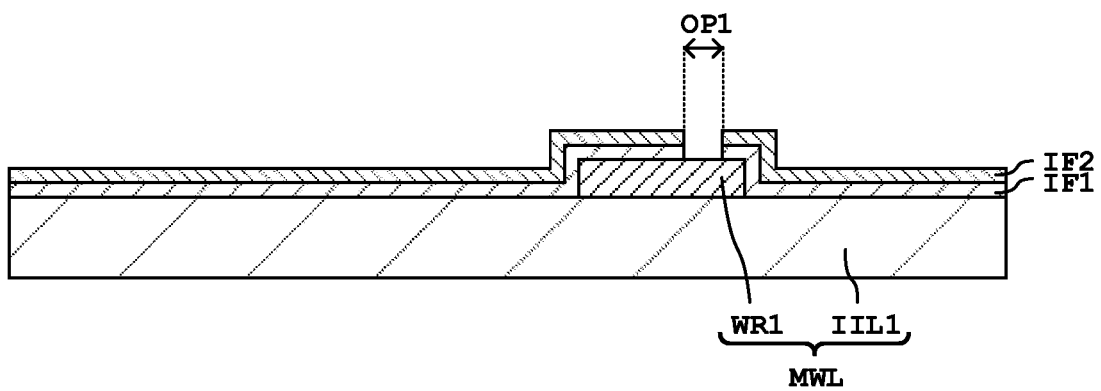
FIG. 7 is a cross-sectional view showing an exemplary step included in the method of manufacturing the semiconductor device according to the first embodiment.

Subsequently, as shown in FIG. 7, the first opening OP1 is formed in the first inorganic film IF1 and the second inorganic film IF2 to expose a portion of the first wiring WR1. For example, the first opening OP1 may be formed by forming a resist mask on the second inorganic film IF2 by a photolithography technique, and then etching the first inorganic film IF1 and the second inorganic film IF2 using the resist mask as an etching mask. At a bottom portion of the first opening OP1, the upper surface of the first wiring WR1 is exposed. Finally, the resist mask is removed.

In the first embodiment, the first opening OP1 is formed in one step on the first inorganic film IF1 and the second inorganic film IF2. However, the opening of the first inorganic film IF1 and the opening of the second inorganic film IF2 may be formed in different steps. The size of the opening of the first inorganic film IF1 may be greater or smaller than the size of the opening of second inorganic film IF2.

(5) Forming an Organic Film OF1

Figure 8:
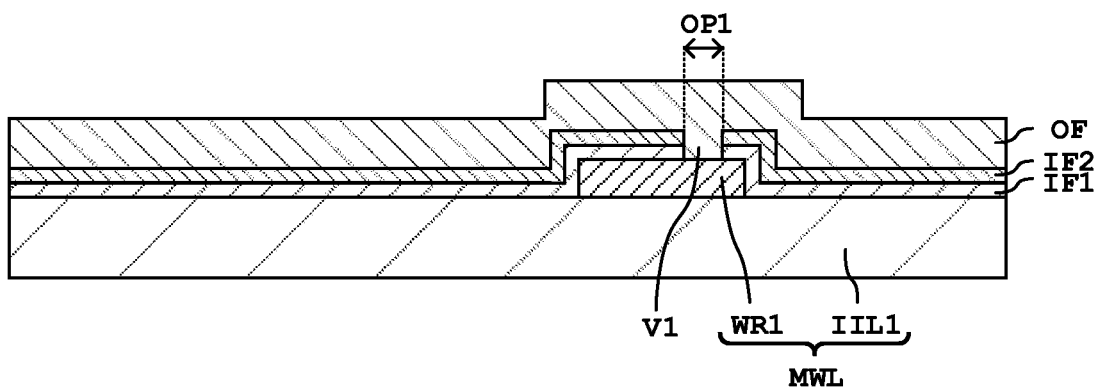
FIG. 8 is a cross-sectional view showing an exemplary step included in the method of manufacturing the semiconductor device according to the first embodiment.

Subsequently, as shown in FIG. 8, the organic film OF1 is formed on the second inorganic film IF2 so as to bury the first opening OP1. For example, the organic film OF1 is formed by coating a photosensitive polyimide precursor solution on the second inorganic film IF2, forming a coating film, and then curing the coating film.

(6) Forming a Second Aperture OP2

Figure 9:
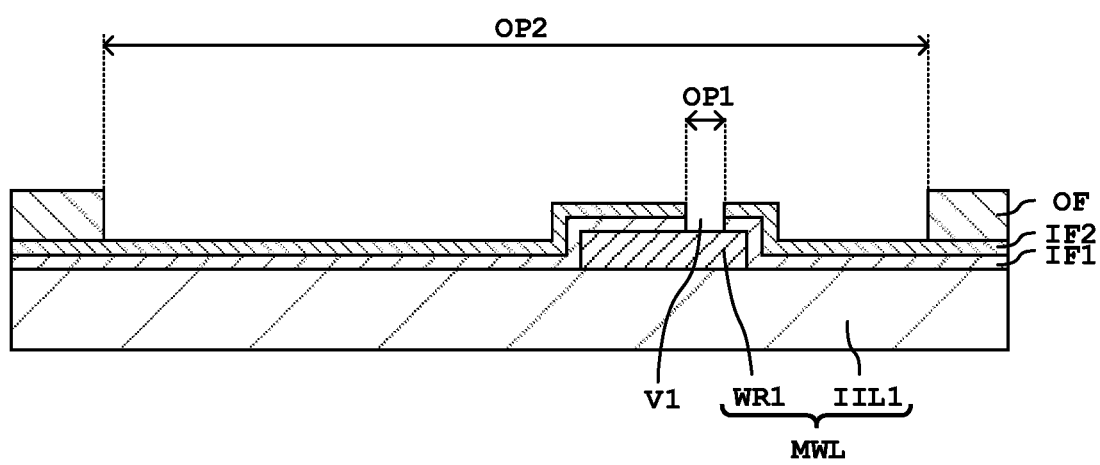
FIG. 9 is a cross-sectional view showing an exemplary step included in the method of manufacturing the semiconductor device according to the first embodiment.

Subsequently, as shown in FIG. 9, the second opening OP2 is formed in the organic film OF1 so as to communicate with the first opening OP1. In the first embodiment, in plan view, the second opening OP2 is formed so that the second opening OP2 overlaps with a region where the crossing part CP is formed and the region where the first via V1 is formed (the first opening OP1).

(7) Formation the Inductor IND

Figure 10:
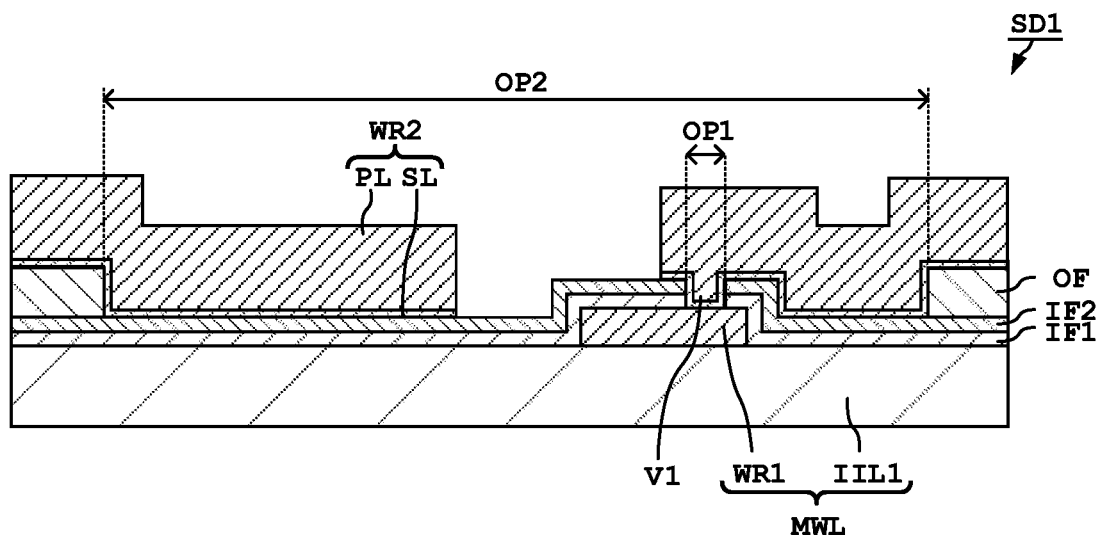
FIG. 10 is a cross-sectional view showing an exemplary step included in the method of manufacturing the semiconductor device according to the first embodiment.

Then, as shown in FIG. 10, to form the second wiring WR2 electrically connected through the first via V1 formed in the first opening OP1. As a result, the inductor IND including the first wiring WR1 and the second WR2 which are electrically connected through the first via V1 is formed.

In the first embodiment, by plating method, the second wiring WR2 is formed integrally with the first via V1 as a single member. Specifically, first, the seed layer SL is formed on the inner surface of the first opening OP1, on the inner surface of the second opening OP2, and on upper surface of the organic film OF1. The method of forming the seed layer SL is, for example, sputtering method. Subsequently, a resist mask is formed on the seed layer SL by photolithography method. Subsequently, the plating layer PL is formed on the seed layer SL exposed from the resist mask by a plating method using the resist mask as a selection mask. As a result, the first via V1 and second wiring WR2 are integrally formed as a single member. Finally, the resist mask and the excess seed layer SL may be removed. Here, the plating method may be an electric field plating method, it may be an electroless plating.

By the above manufacturing method, the semiconductor device SD1 according to the first embodiment can be manufactured.

(Main Features of First Embodiment)

First, from the viewpoint of clarifying the main features of first embodiment, we will explain a comparative semiconductor device rSD.

Figure 11:
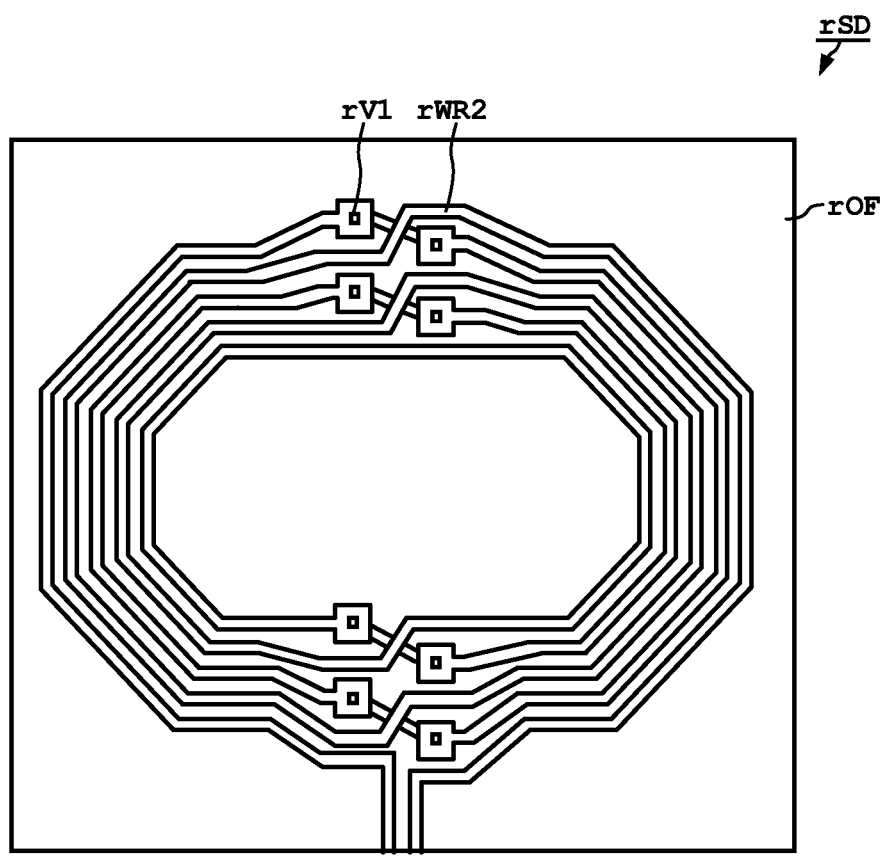
FIG. 11 is a plan view showing an exemplary configuration of a main portion of a comparative semiconductor device.
Figure 12:
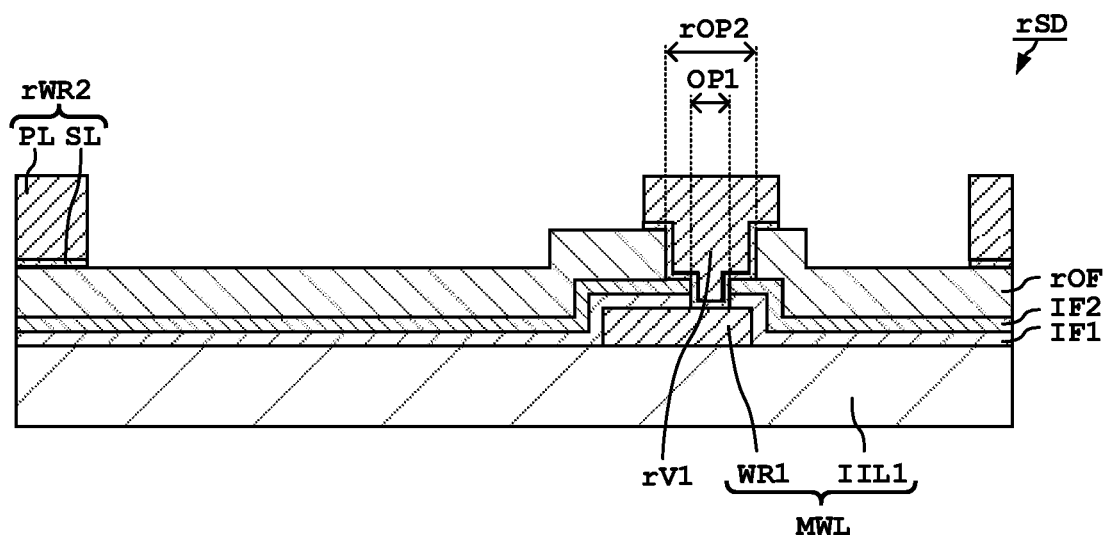
FIG. 12 is a cross-sectional view showing an exemplary configuration of the main portion of the comparative semiconductor device.

FIG. 11 is a plan view showing an exemplary configuration of a main portion of the comparative semiconductor device rSD. FIG. 12 is a cross-sectional view showing an exemplary configuration of a main portion of the comparative semiconductor device rSD. FIG. 12 shows a portion corresponding to FIG. 3A.

As shown in FIG. 12, in the comparative semiconductor device rSD, the second opening rOP2 formed in the organic film rOF exposes a portion, of the first inorganic film IF1 and the second inorganic film IF2, covering an upper surface of the first wiring WR1. On the other hand, the second opening rOP2 also covers a portion, of the first inorganic film IF1 and the second inorganic film IF2, covering the side surface of the first wiring WR1. Thus, in the semiconductor device rSD, the first via rV1 is formed not only in the first opening OP1, but also in the second opening OP2. That is, the side surface of the first via V1 contacts with the first inorganic film IF1, the second inorganic film IF2, and the organic film OF over an entire circumference.

In the semiconductor device rSD, when forming the second opening rOP2 in the organic film OF, the position where the second opening rOP2 is formed must be aligned with the position of the first opening OP1. Because of the limitations of alignment accuracy, the second aperture rOP2 is formed to some extent. As a result, as shown in FIG. 11, among the second wiring rWR2, it is required to increase the size (width) of the portion located in the vicinity of the first via rV1. This increases the size of the inductor IND and consequently the semiconductor device rSD.

In contrast, in the semiconductor device SD1 according to the first embodiment, the second opening OP2 formed in the organic film OF1 exposes both the portion covering the side surface of the first wiring WR1 and the portion covering upper surface of the first wiring WR1, of the first inorganic film IF1 and the second inorganic film IF2. Therefore, although the first via V1 is formed in the first opening OP1, it is not formed in the second opening OP2 (see FIG. 3A). In other words, the side surface of the first via V1 contacts with the first inorganic film IF1 and the second inorganic film IF2, but does not contact with the organic film OF1. As a result, the first via V1 can be formed at a desired position regardless of the positional accuracy of the second opening OP2. Therefore, as in the comparative semiconductor device rSD, of the second wiring rWR2, it is not required to increase the size of the portion located in the vicinity of the first via V1. As a result, the semiconductor device SD1 can be miniaturized according to the first embodiment.

(effect)

In the semiconductor device SD1 according to the first embodiment, the side surface of the first via V1 contacts with the first inorganic film IF1 and the second inorganic film IF2, but does not contact with the organic film OF. Thus, as described above, the semiconductor device SD1 can be miniaturized.

Further, in the semiconductor device SD1 according to the first embodiment, the inductor IND is not formed of only wiring layers formed in the multilayer wiring layer MWL, but is mainly formed of the first inorganic film IF1, the second inorganic film IF2, and the wiring (so-called redistribution wiring) formed on the organic film OF. Thus, the inductor IND, by being configured by the redistribution wiring of the thick film, it is possible to increase the characteristics of the inductor IND (for example, Q-value).

[First Modification]

Figure 13:
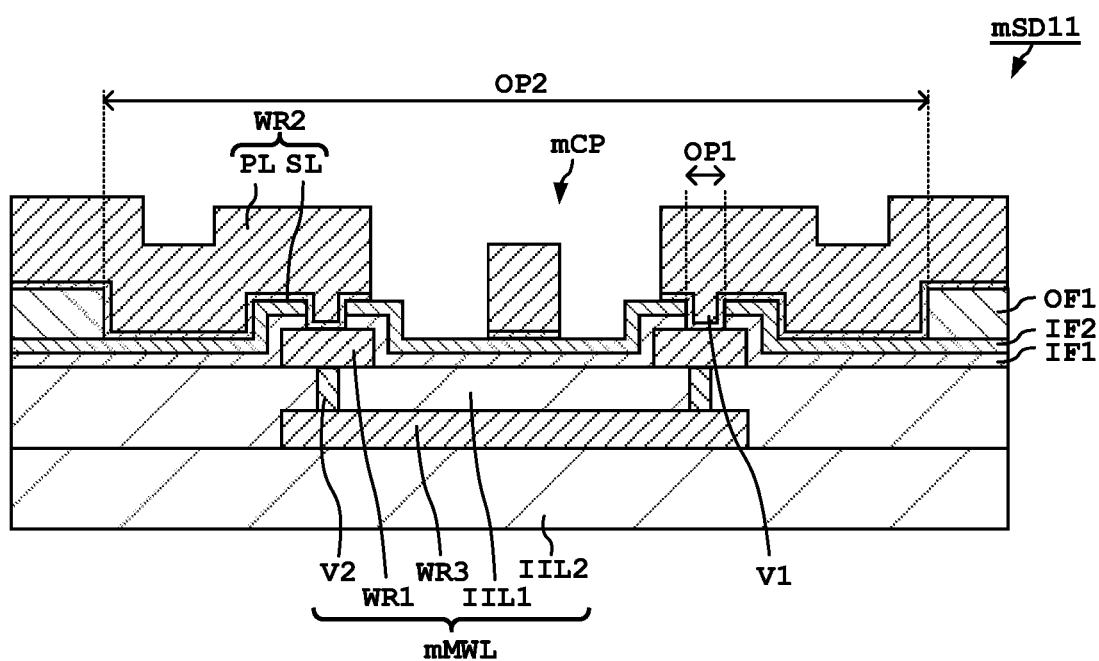
FIG. 13 is a partially enlarged cross-sectional view showing an exemplary configuration of a main portion of a semiconductor device according to a first modification of the first embodiment.

FIG. 13 shows a partially enlarged cross-sectional view showing an exemplary configuration of a main portion of a semiconductor device mSD11 according to a first modification of the first embodiment. FIG. 13 shows a portion of the semiconductor device mSD11 corresponding to the portion shown in FIG. 3B.

In the semiconductor device mSD11, a multilayer wiring layer mMWL includes a first interlayer insulating layer IIL1, a first wiring WR1, a second interlayer insulating layer IIL2 and a third wiring WR3.

The second interlayer insulating layer IIL2 is an insulating layer located in a lower layer than the first interlayer insulating layer IIL1. The second interlayer insulating layer IIL2 is one layer than the first interlayer insulating layer IIL1, may be located in the lower layer, more than two layers, may be located in the lower layer. In the first modification, the second interlayer insulating layer IIL2 is located in a lower layer than the first interlayer insulating layer IIL1 by one layer.

The third wiring WR3 is a wiring located in a lower layer than the first wiring WR1. The third wiring WR3 may be located in a lower layer than the first wiring WR1 by one layer, or may be located in the lower layer than the first wiring WR1 by more than one layer. In the first modification, the third wiring WR3 is located at a lower layer than the first wiring WR1 by one layer.

The first wiring WR1 and the third wiring WR3 are electrically connected with each other through the second via V2. The second via V2 includes, for example, a barrier metal film and a conductive film formed on the barrier metal film. Examples of material of the barrier metal film include titanium (Ti) and titanium nitride (TiN). The material of the conductive film is, for example, tungsten (W).

In the semiconductor device mSD11 according to the first modification, a crossing part mCP is constituted of the third wiring WR3 and the second wiring W2. That is, the crossing part mCP is formed by the third wiring WR3 and the second wiring WR2, which are located lower than the uppermost layer wiring (the first wiring WR1) of the multilayer wiring layer mMWL. When the uppermost layer wiring (the first wiring WR1) and the second wiring WR2 constitute the crossing part CP as in first embodiment, a step caused by the first wiring WR1 is formed on a surface of the first inorganic film IF1 and the second inorganic film IF2 in the crossing part CP. For this reason, in the crossing part CP, the second wiring WR2 needs to cross the first wiring WR1 while climbing the step. As a result, stresses generated at the crossing part CP become large, and cracks may occur in one or both of the first inorganic film IF1 and second inorganic film IF2. On the other hand, in the semiconductor device mSD11 according to the first modification, the second wiring WR2 crosses the third wiring WR3 located in a lower layer than the uppermost layer wiring. In this instance, since the surface of the first interlayer insulating layer IIL1 covering the third WR3 is flattened, the step does not occur in the first inorganic film IF1 and the second inorganic film IF2. The increase in stress occurring at the crossing part mCP can be suppressed. As a result, the reliability of the semiconductor device mSD11 can be enhanced further.

[Second Modification]

Figure 14:
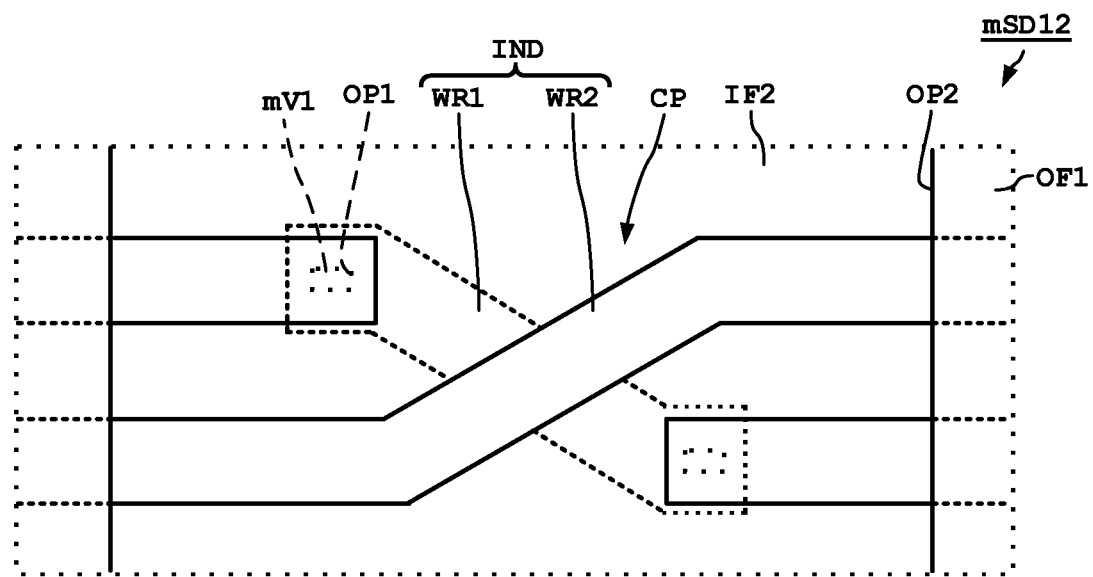
FIG. 14 is a partially enlarged cross-sectional view showing an exemplary configuration of a main portion of a semiconductor device according to a second modification of the first embodiment.

FIG. 14 shows a partially enlarged cross-sectional view showing an example of a main portion of a semiconductor device mSD12 according to a second modification of the first embodiment. FIG. 14 shows a portion of the semiconductor device mSD12 corresponding to the portion shown in FIG. 2.

In the semiconductor device mSD12, a first via mV1 has a long diameter along an extending direction of the second wiring WR2 and a short diameter along a width direction of the second wiring WR2 in plan view. From the viewpoint of reducing the resistance of the first via mV1, it is preferable that the first via mV1 has a large long diameter. In addition, from the viewpoint of increasing the stress-resistance of the first inorganic film IF1 and the second inorganic film IF2 covering the first wiring WR1, it is preferable that the short diameter of the first via mV1 is small. As a result, a contacting area between the upper surface of the first wiring layer WR1 and the first inorganic film IF1 and the second inorganic film IF2 is increased. As a result, the first inorganic film IF1 and the second inorganic film IF2 suppress deformation of the first wiring WR1 due to external stresses that cause cracks in the first inorganic film IF1 and the second inorganic film IF2.

As described above, it is preferable that a ratio of the long diameter of the second wiring WR2 to the short diameter of the second WR2 is large. In the second wiring WR2, the ratio of the long diameter to the short diameter is appropriately adjusted in accordance with the size, material, and the like of the first via mV1. For example, the ratio of the long diameter to the short diameter is, for example, 2 or more and 4 or less.

Here, the long diameter of the second wiring WR2 is the greatest length of the first via mV1 in the extending direction of the second wiring WR2 in plan view. The long diameter of the second wiring WR2 is the smallest length of the first via mV1 in the width direction of the second wiring WR2 in the plan view.

Second Embodiment

In a semiconductor device SD2 according to a second embodiment, a second opening OP2 formed in the organic film OF2 overlaps with the first via V1 in plan view, but does not overlap with the crossing part CP.

(Configuration of Semiconductor Device)

Figure 15:
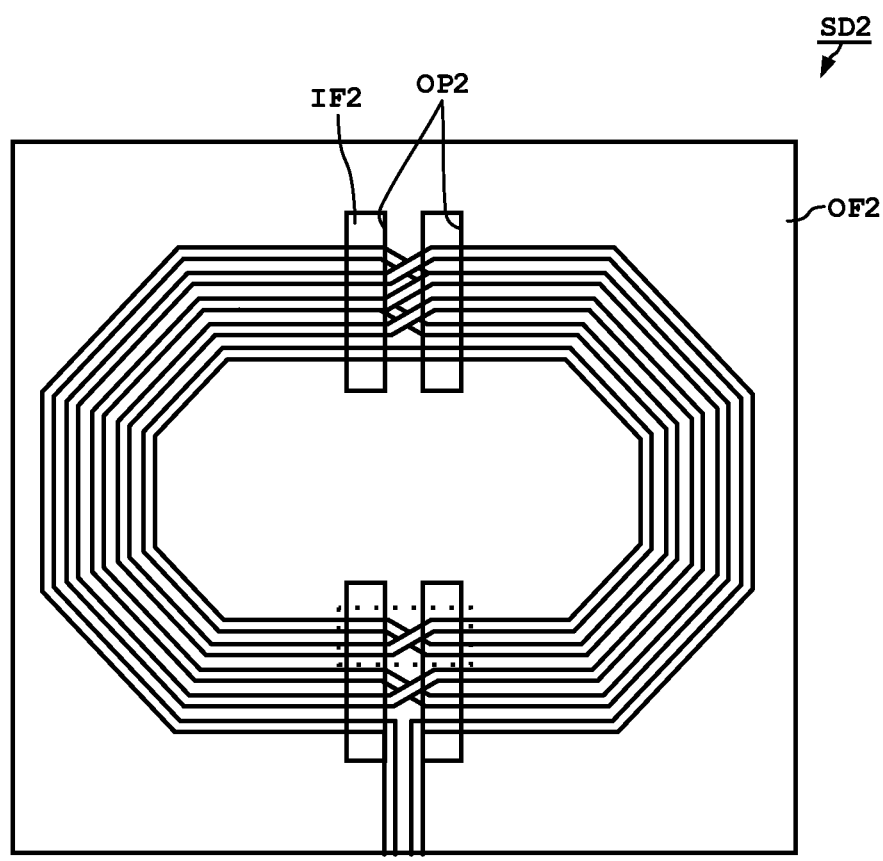
FIG. 15 is a plan view showing an exemplary configuration of a main portion of a semiconductor device according to a second embodiment.
Figure 16:
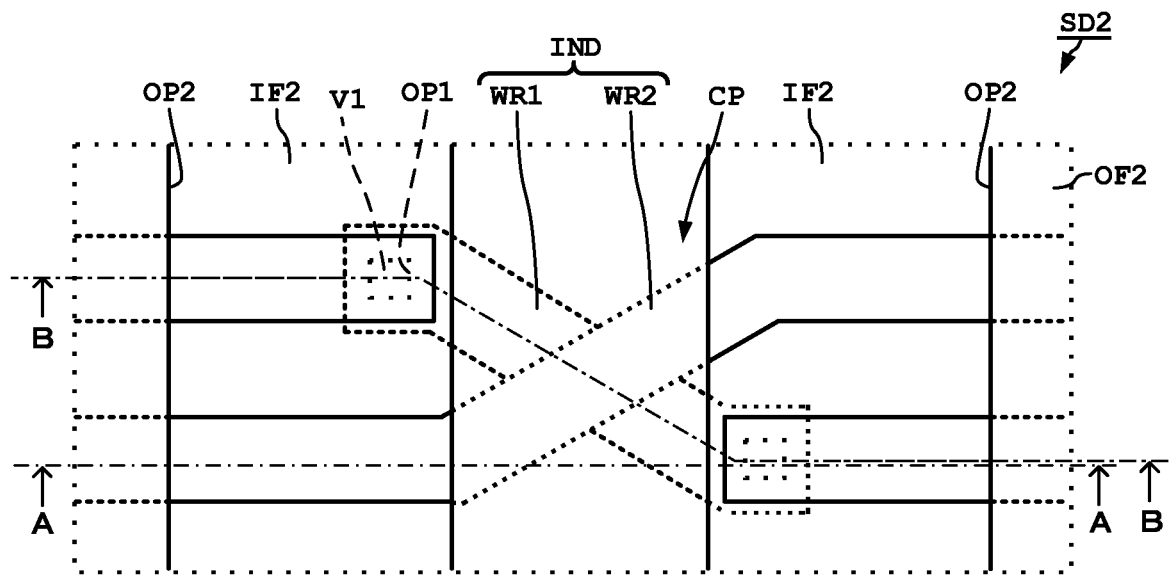
FIG. 16 is a partially enlarged plan view showing a region indicated by a dashed line in FIG. 15.
Figure 17A:
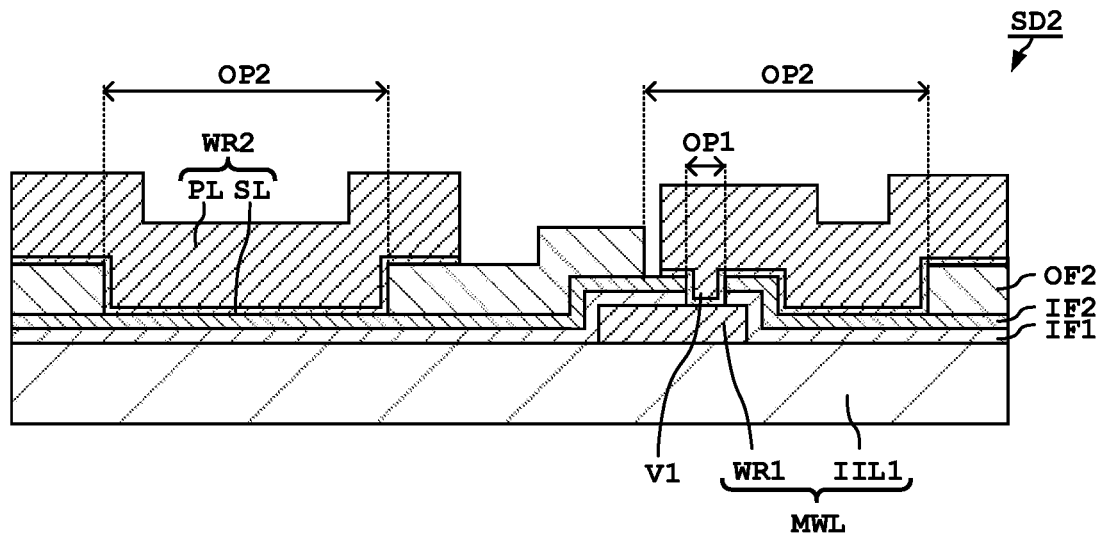
FIG. 17A is a cross-sectional view taken along line A-A of FIG. 16.
Figure 17B:
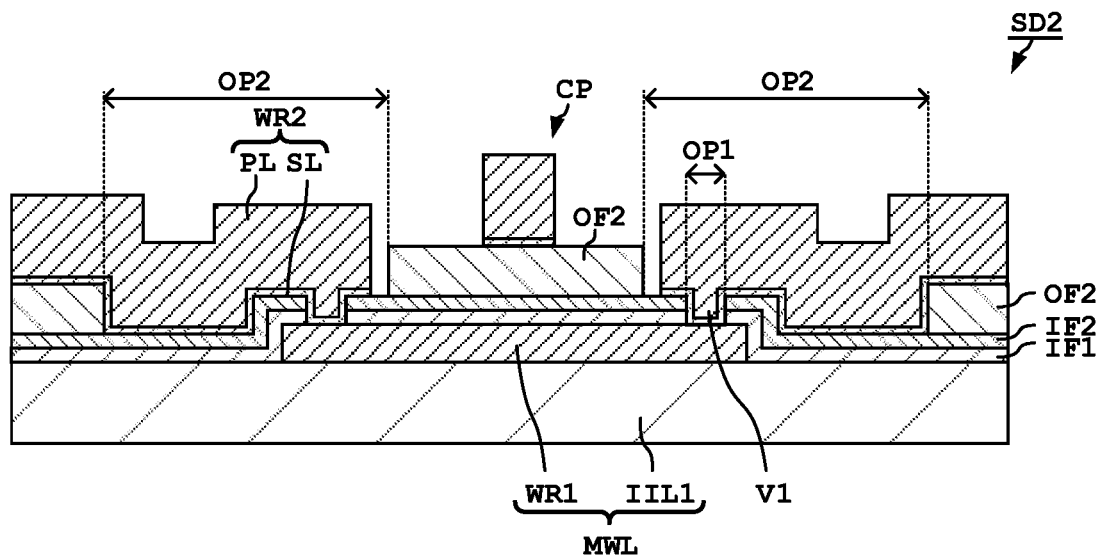
FIG. 17B is a cross-sectional view taken along line B-B of FIG. 16.

FIG. 15 is a plan view showing an exemplary configuration of a main portion of a semiconductor device SD2 according to a second embodiment. FIG. 16 is a partially enlarged plan view showing a region indicated by the dashed line in FIG. 15. FIG. 17A is a cross-sectional view taken along line A-A of FIG. 16. FIG. 17B is a cross-sectional view taken along line B-B of FIG. 16.

The semiconductor device SD2 includes a multilayer wiring layer MWL, a first inorganic film IF1, a second inorganic film IF2, an organic film OF2, and an inductor IND. The semiconductor device SD2 differs from the semiconductor device SD1 according to the first embodiment only in the position and number of the second opening OP2 formed in the organic film OF2. Therefore, the same constituent elements as those of the semiconductor device SD1 according to the first embodiment are denoted by the same reference numerals, and descriptions thereof are omitted.

A second opening OP2 is formed in the organic film OF2 to expose a portion of the second inorganic film IF2 from the organic film OF2. The second opening OP2 communicates with the first opening OP1. A size of the second opening OP2 is greater than a size of the first opening OP1. The second opening OP2 is formed such that the second opening OP2 exposes a portion, of the first inorganic film IF1 and the second inorganic film IF2, covering the side surface of second wiring WR2 from the second inorganic film IF2. The second opening OP2 is formed such that the second opening OP2 exposes a portion, of the first inorganic film IF1 and the second inorganic film IF2, covering the upper surface of the second wiring WR2 is also exposed from the second inorganic film IF2. The side surface of the organic film OF2 is separated from the side surface of the second wiring WR2.

In the second embodiment, the second opening OP2 overlaps with the first via V1 in plan view, but does not overlap with the crossing part CP. The number of first vias V1 overlapping with the second opening OP2 in plan view is appropriately adjusted in accordance with the number of turns of the inductor IND. The number of the first vias V1 overlapping with the second opening OP2 in the plan view may be two or more, or may be three or more. In the second embodiment, the number of the first vias V1 overlapping with the second opening OP2 in plan view is four.

(Method of Manufacturing Semiconductor Device)

A method of manufacturing a semiconductor device SD2 according to the second embodiment includes (1) forming a multilayer wiring layer MWL, (2) forming the first inorganic film IF1, (3) forming a second inorganic film IF2, (4) forming the first opening OP1, (5) forming the organic film OF2, (6) forming a second opening OP2, and (7) forming an inductor IND.

A method of manufacturing the semiconductor device SD2 according to the second embodiment is the same as the method of manufacturing the semiconductor device SD1 according to the first embodiment, except that the position and number of the second opening OP2 differ in the step of forming the second opening OP2. Therefore, a detailed explanation of the method of manufacturing the semiconductor device SD2 according to the second embodiment is omitted.

(Effect)

Also, in the semiconductor device SD2 according to the second embodiment, the side surface of the first via V1 contacts with the first inorganic film IF1 and the second inorganic film IF2, but does not contact with the organic film OF2. Thus, the second embodiment has the same effects as the first embodiment. Further, in the second embodiment according to the second embodiment, the second opening OP2 formed in the organic film OF2 overlaps with the first via V1 in plan view, but does not overlap with the crossing part CP. Thus, in the semiconductor device SD2, a region of the organic film OF2 covering the multilayer wiring layer MWL is increased, as a result, it is possible to further enhance the moisture resistance of the semiconductor element.

It should be noted that the present invention is not limited to the above-mentioned embodiments, and various modifications can be made without departing from the gist thereof. For example, the first via V1 and the second wiring WR2 may be formed separately. In this instance, after the first via V1 is formed, the second WR2 wiring may be formed.

In the above embodiment, the semiconductor device including the first inorganic film IF1, the second inorganic film IF2, and the organic film OF1, OF2 have been described. But a semiconductor device according to another embodiment may include any two of the first inorganic film IF1, the second inorganic film IF2, and the organic film OF1, OF2. For example, the semiconductor device may include a first inorganic film having a first opening OP1 and a second inorganic film having a second opening OP2. Examples of the material of the first inorganic film and examples of the material of second inorganic film are silicon oxide, silicon oxynitride, or silicon nitride.

In addition, even when a specific numerical value example is described, it may be a numerical value exceeding the specific numerical value, or may be a numerical value less than the specific numerical value, except when it is theoretically obviously limited to the numerical value. In addition, the component means "B containing A as a main component" or the like, and the mode containing other components is not excluded.

What is claimed is:

1. A semiconductor device comprising:
a multilayer wiring layer comprising a first wiring;
a first insulating film formed on the multilayer wiring layer and having a first opening exposing a portion of the first wiring;
a second insulating film formed on the first insulating film and having a second opening continuing with the first opening; and
an inductor formed of:
the first wiring; and
a second wiring electrically connected with the first wiring through a via formed in the first opening,
wherein a side surface of the via contacts with the first insulating film, and does not contact with the second insulating film,
wherein the inductor includes a crossing part at which the first wiring and the second wiring cross with each other in plan view, and
wherein the crossing part overlaps with the second opening.

2. The semiconductor device according to claim 1, wherein a lower surface of the second wiring directly contacts with an upper surface of the first insulating film in the second opening.

3. The semiconductor device according to claim 1, wherein a lower surface of the second wiring directly contacts with an upper surface of the second insulating film outside the second opening.

4. The semiconductor device according to claim 1, wherein, in plan view, the via has:
a long diameter along an extending direction of the second wiring; and
a short diameter along a width direction of the second wiring.

5. The semiconductor device according to claim 1,
wherein the multilayer wiring layer comprises a third wiring located at a lower layer than the first wiring,
wherein the inductor includes a crossing part at which the second wiring and the third wiring cross with each other in plan view, and
wherein the crossing part, in plan view, overlaps with the second opening.

6. The semiconductor device according to claim 1, wherein the inductor has a substantially octagonal shape in plan view.

7. The semiconductor device according to claim 1, wherein a material of the first insulating film is silicon oxide, silicon oxynitride or silicon nitride.

8. The semiconductor device according to claim 1, wherein a material of the second insulating film is silicon oxide, silicon oxynitride, silicon nitride or polyimide.

9. The semiconductor device according to claim 8, wherein the material of the second insulating material is polyimide.

10. The semiconductor device according to claim 1, wherein the first wiring is aluminum wiring, and
wherein the second wiring is copper wiring.

11. The semiconductor device according to claim 1, comprising a third insulating film formed between the multilayer wiring layer and the first insulating film,
wherein the first opening is formed in the first insulating layer and the third insulating layer.

* * * * *